(12) United States Patent
Niewczas et al.

(10) Patent No.: US 9,692,553 B2
(45) Date of Patent: Jun. 27, 2017

(54) METHOD AND DEVICE FOR DECODING A TRANSPORT BLOCK OF A COMMUNICATION SIGNAL

(71) Applicant: Telefonaktiebolaget L M Ericsson (publ), Stockholm (SE)

(72) Inventors: Jaroslaw Niewczas, Jozefow (PL); Michal Stala, Lund (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 140 days.

(21) Appl. No.: 14/349,372

(22) PCT Filed: Oct. 2, 2012

(86) PCT No.: PCT/EP2012/069419
§ 371 (c)(1),
(2) Date: Apr. 3, 2014

(87) PCT Pub. No.: WO2013/050350
PCT Pub. Date: Apr. 11, 2013

(65) Prior Publication Data
US 2014/0247909 A1 Sep. 4, 2014

Related U.S. Application Data

(60) Provisional application No. 61/544,816, filed on Oct. 7, 2011.

(30) Foreign Application Priority Data

Oct. 5, 2011 (EP) .................................... 11183981

(51) Int. Cl.
*H03M 13/00* (2006.01)
*H04L 1/00* (2006.01)
(Continued)

(52) U.S. Cl.
CPC ........ *H04L 1/0045* (2013.01); *H03M 13/253* (2013.01); *H03M 13/2975* (2013.01); *H03M 13/353* (2013.01)

(58) Field of Classification Search
CPC ........... H03M 13/253; H03M 13/2975; H03M 13/353
(Continued)

(56) References Cited

U.S. PATENT DOCUMENTS 6,526,538 B1 * 2/2003 Hewitt ............. H03M 13/2918
375/262
7,783,958 B1    8/2010 Eidson et al.
(Continued)

FOREIGN PATENT DOCUMENTS

CN    101567752 A    10/2009
CN    101771423 A    7/2010
(Continued)

OTHER PUBLICATIONS

Ambroze, A., et al., "Practical aspects of iterative decoding", IEEE Proceedings—Communications, Apr. 14, 2000, pp. 69-74, vol. 147, issue 2, IET.
(Continued)

*Primary Examiner* — Daniel Washburn
*Assistant Examiner* — Berhanu Tadese
(74) *Attorney, Agent, or Firm* — Coats & Bennett, P.L.L.C.

(57) ABSTRACT

The present invention relates to a device and method of decoding code blocks of a transport block of a communication signal using a decoder. The method comprises making an assumption about how many decoder iterations should be used for different code blocks of the code blocks of the transport block, wherein the assumption is made based on a study of code block soft-bits. The method also comprises
(Continued)

decoding the transport block using different numbers of decoder iterations for the different code blocks, based on the made assumption about how many decoder iterations should be used for the different code blocks.

20 Claims, 8 Drawing Sheets

(51) Int. Cl.
*H03M 13/25* (2006.01)
*H03M 13/29* (2006.01)
*H03M 13/35* (2006.01)
(58) Field of Classification Search
USPC ........................................................ 375/340
See application file for complete search history.

(56) References Cited

U.S. PATENT DOCUMENTS

| | | | | |
|---|---|---|---|---|
| 7,895,506 | B2 * | 2/2011 | Bhora | H04L 1/0051 714/794 |
| 2002/0029362 | A1 * | 3/2002 | Stephen | H03M 13/258 714/752 |
| 2003/0081690 | A1 | 5/2003 | Kim et al. | |
| 2003/0110437 | A1 * | 6/2003 | Kim | G11B 20/1833 714/752 |
| 2004/0128592 | A1 * | 7/2004 | Park | H03M 13/45 714/709 |
| 2006/0168500 | A1 * | 7/2006 | Whinnett | H04L 1/005 714/794 |
| 2007/0118790 | A1 * | 5/2007 | Kim | H03M 13/09 714/781 |
| 2008/0212657 | A1 * | 9/2008 | Bjerke | H04L 1/0003 375/150 |
| 2009/0013356 | A1 * | 1/2009 | Doerr | H04L 65/4076 725/62 |
| 2009/0037791 | A1 * | 2/2009 | Pavlov | H03M 13/1131 714/752 |
| 2009/0077457 | A1 * | 3/2009 | Ramesh | H03M 13/2975 714/807 |
| 2009/0103653 | A1 * | 4/2009 | Haiut | H03M 13/2957 375/316 |
| 2009/0132894 | A1 * | 5/2009 | Xu | H03M 13/27 714/780 |
| 2009/0132897 | A1 * | 5/2009 | Xu | H03M 13/6331 714/796 |
| 2009/0164748 | A1 * | 6/2009 | Mansour | H03M 13/27 711/202 |
| 2009/0271688 | A1 * | 10/2009 | Jiang | H03M 13/1111 714/784 |
| 2010/0098194 | A1 * | 4/2010 | Reial | H04B 1/71072 375/341 |
| 2010/0251082 | A1 * | 9/2010 | Cheng | H03M 13/09 714/807 |
| 2010/0272011 | A1 * | 10/2010 | Palanki | H04L 1/005 370/328 |
| 2011/0246849 | A1 * | 10/2011 | Rault | H03M 13/1128 714/752 |
| 2011/0280133 | A1 * | 11/2011 | Chang | H04L 1/0052 370/241 |
| 2012/0106683 | A1 * | 5/2012 | Zhao | H03M 13/2957 375/341 |
| 2012/0131415 | A1 * | 5/2012 | Park | H03M 13/1128 714/758 |
| 2013/0297993 | A1 * | 11/2013 | Murakami | H03M 13/036 714/786 |

FOREIGN PATENT DOCUMENTS

| | | | |
|---|---|---|---|
| CN | 102130747 A | 7/2011 | |
| EP | 1313247 B1 | 11/2005 | |
| EP | 1701450 A1 | 9/2006 | |
| EP | 1786109 A1 | 5/2007 | |
| EP | 2202887 A1 | 6/2010 | |
| EP | 0973292 B1 | 1/2013 | |
| GB | 2432495 A | 10/2006 | |
| GB | 2445006 A | 6/2008 | |
| KR | EP 1701450 A1 * | 9/2006 | ............ H03M 13/11 |
| SE | EP 2579468 A1 * | 4/2013 | .......... H03M 13/253 |
| WO | 2004004133 A1 | 1/2004 | |
| WO | 2008077421 A1 | 7/2008 | |
| WO | 2010136930 A2 | 12/2010 | |

OTHER PUBLICATIONS

3rd Generation Partnership Project, "3rd Generation Partnership Project; Technical Specification Group Radio Access Network; Multiplexing and channel coding (Release 8)", 3GPP TS 36.212 V1.2.0, May 1, 2007, pp. 1-16, 3GPP, France.
Kim, S. et al., "Simple interactive decoding stop criterion for wireless packet transmission", Electronic Letters, Nov. 23, 2000, pp. 2026-2027, vol. 36, No. 24, Institution of Engineering and Technology.
Salmela, P., et al., "On Allocation of Turbo Decoder Interations", 14th IEEE Proceedings on Personal, Indoor and Mobile Radio Communications, Sep. 7, 2003, pp. 157-160, vol. 1, IEEE.

* cited by examiner

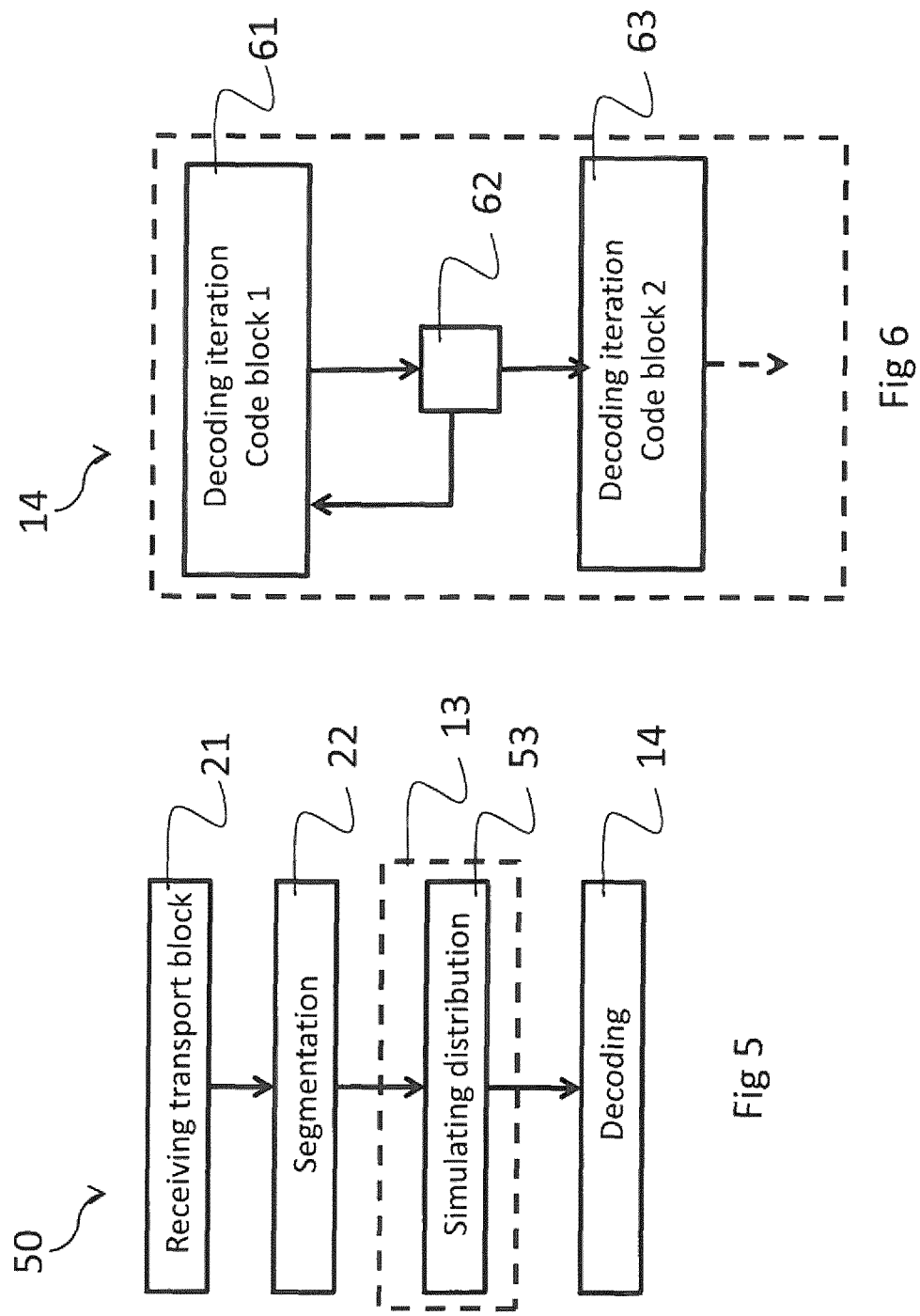

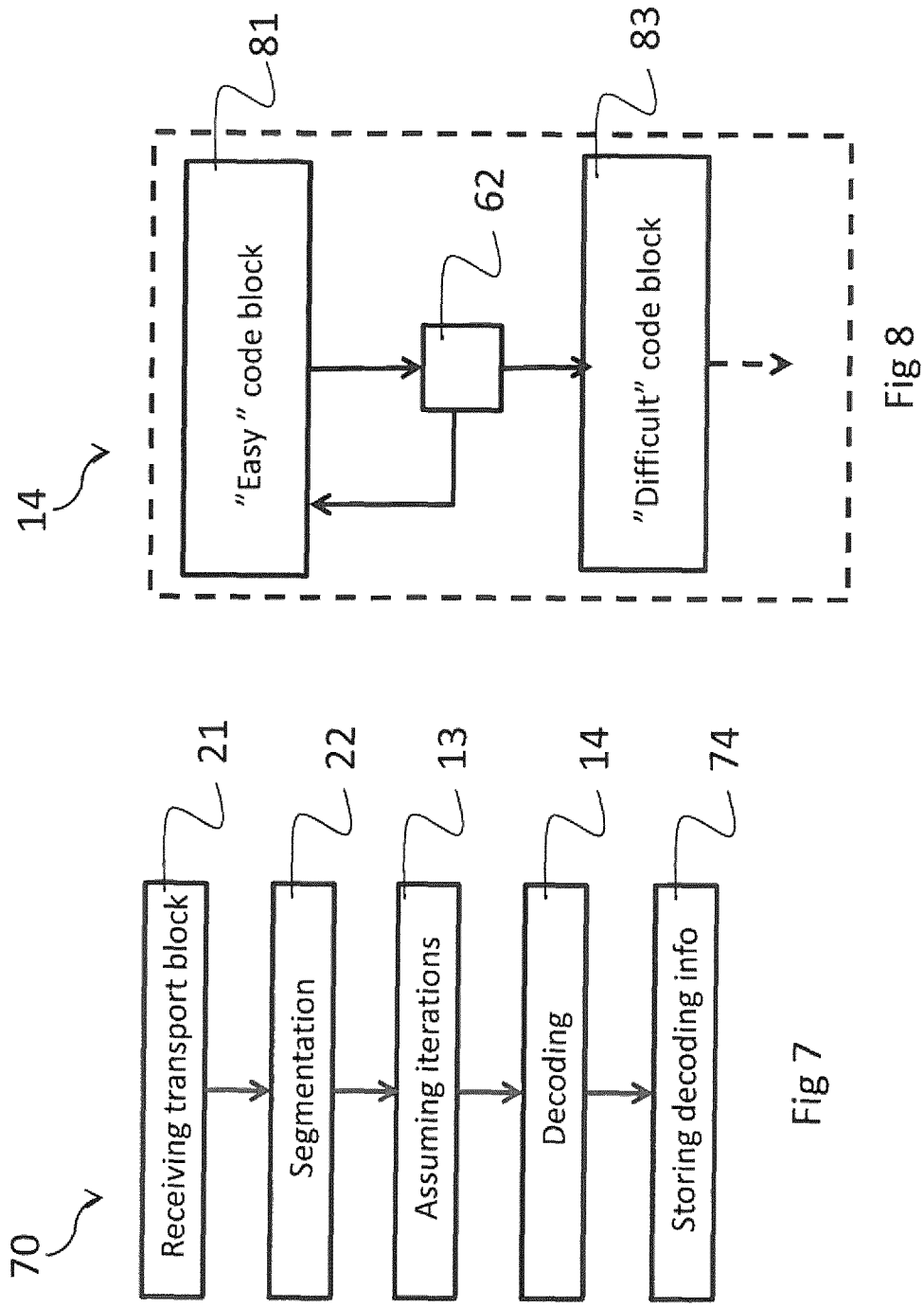

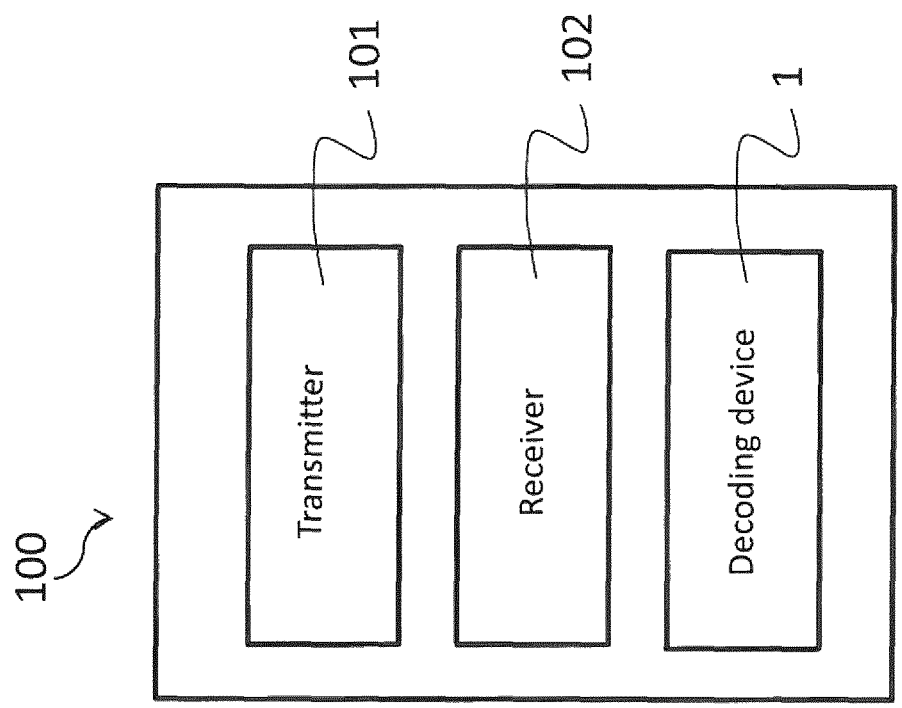

METHOD AND DEVICE FOR DECODING A TRANSPORT BLOCK OF A COMMUNICATION SIGNAL

TECHNICAL FIELD

The invention relates to a method of decoding code blocks of a transport block of a communication signal using a decoder, as well as to a device for decoding code blocks of a transport block of a communication signal using a decoder, and a transmit-receive unit comprising such a device.

BACKGROUND

In wire bound or wireless communications, the transmitted signal may need to be decoded upon reception. In many communication standards, such as WCDMA/LTE, the signal is transmitted in transport blocks which may then, if needed, be segmented into code blocks. As communication standards evolve over time, more data is transmitted per time unit, e.g. due to higher orders of modulation, such as QAM16 and QAM64. While maximum transport block size grew with evolving standards, the maximum code block sizes remained the same, 5114 for WCDMA and 6144 for LTE, resulting in an increased number of code blocks per transport block.

Upon reception of a transport block, soft-bits are generated for the transmitted bits of the transport block, defining the accuracy of the received transmitted bits.

A decoder is used to iteratively decode the transmitted bits of the received transport block, one code block at the time. In order to increase the bandwidth and/or reduce the power consumption of the communication path, the transport block is preferably decoded using as few iterations as possible, without failing to decode it. However, code blocks of a transport block may be more or less easy to decode and often a fixed number of iterations are assigned to each code block, which number is presumed to be sufficient also for the more difficult code blocks, whereby superfluous iterations may be assigned to code blocks more easy to decode and too few iterations may be assigned to the more difficult ones.

Perttu Salmela et al. discloses in their article "On Allocation of Turbo Decoder Iterations" from the 14$^{th}$ IEEE 2003 International Symposium on Personal, Indoor and Mobile Radio Communication Proceedings that, since the number of required iterations for each code block is not known beforehand, an additional buffering of incoming code blocks can be used to allow utilization of unused iterations. This is because the code blocks arrive to the input buffer at a constant rate, whereas the decoding rate of the blocks varies.

SUMMARY

According to one aspect of the present invention, there is provided a method of decoding code blocks of a transport block of a communication signal using a decoder. The method comprises making an assumption about how many decoder iterations should be used for different code blocks of the code blocks of the transport block, wherein the assumption is made based on a study of code block soft-bits. The method also comprises decoding the transport block using different numbers of decoder iterations for the different code blocks, based on the made assumption about how many decoder iterations should be used for the different code blocks.

According to another aspect of the present invention, there is provided a device for decoding code blocks of a transport block of a communication signal. The device comprises a pre-decoding processing unit configured to make an assumption about how many decoder iterations should be used for different code blocks of the code blocks of the transport block, wherein the assumption is made based on a study of code block soft-bits. The device also comprises a decoder configured to decode the transport block using different numbers of decoder iterations for the different code blocks, based on the made assumption about how many decoder iterations should be used for the different code blocks.

According to another aspect of the present invention, there is provided a device for decoding code blocks of a transport block of a communication signal. The device comprises means for making an assumption about how many decoder iterations should be used for different code blocks of the code blocks of the transport block, wherein the assumption is made based on a study of code block soft-bits. The device also comprises means for decoding the transport block using different numbers of decoder iterations for the different code blocks, based on the made assumption about how many decoder iterations should be used for the different code blocks.

According to another aspect of the present invention, there is provided a transmit-receive unit. The transmit-receive unit comprises a transmitter for transmitting radio signals, a receiver for receiving radio signals, and a device of any one of the above aspects of the present invention.

Discussions above and/or below in respect of any of the aspects of the present invention are also relevant to any other aspects of the present invention if applicable.

The present invention is at least partly based on the realisation that different code blocks from the same transport block are not equally easy to decode by means of a decoder such as a turbo decoder or a Viterbi decoder, and that this may at least partly depend on the mixture of soft-bits in the different code blocks. It is thus possible to, in accordance with the present invention, improve the decoding efficiency of a transport block by studying soft-bit mixtures of code blocks and use variable number of iterations for the different code blocks based on this study of soft-bits. By means of the present invention more optimal decoder scheduling may be achieved, such as more optimal turbo decoder (TDEC) scheduling. The present invention may be relevant to any communication standard where the size of a transport block may be larger than the maximum code block size, whereby the transport block may need to be divided into a plurality of code blocks for decoding.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which:

FIG. 5 is a schematic process chart of another embodiment of a method of the present invention.

FIG. 6 is a schematic process chart of another embodiment of a method of the present invention.

FIG. 7 is a schematic process chart of another embodiment of a method of the present invention.

FIG. 8 is a schematic process chart of another embodiment of a method of the present invention.

FIG. 15 is a schematic diagram of an embodiment of a transmit-receive unit of the present invention.

DETAILED DESCRIPTION

Figure 2:
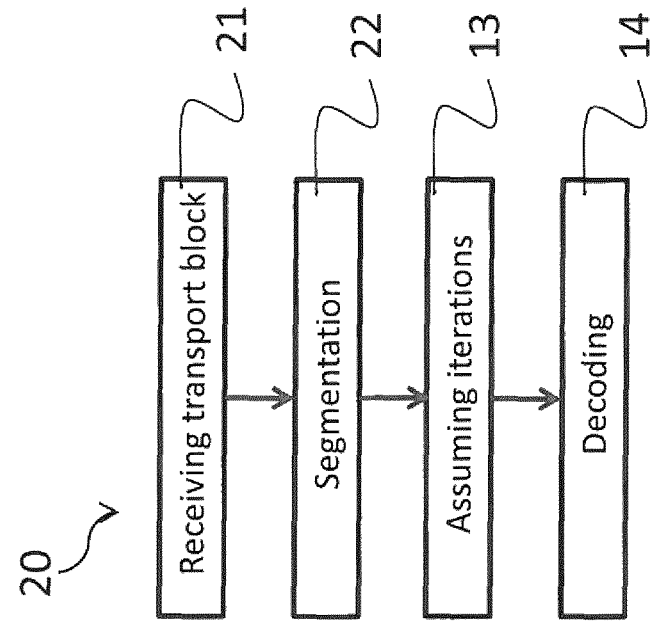
FIG. 2 is a schematic process chart of another embodiment of a method of the present invention.

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art Like numbers refer to like elements throughout the description.

In the present disclosure, the terms "transport block" and "code block" are used. These terms should not limit the disclosure to any specific standards, such as WCDMA/LTE, using this specific terminology, but the terms should be interpreted more generally.

The method of the present invention may be performed in/by, and/or the device of the present invention may be included in, any unit that may need to decode a transport block of a communication signal. If the communication signal is wireless, the unit may e.g. be a mobile transmit-receive unit, such as a mobile phone (cell phone) or other mobile user equipment, or a base station, Node-B or the like.

The present invention may be relevant for different types of decoders and decoding standards, such as turbo decoding or Viterbi decoding. In the following, the invention will be discussed often in relation to turbo decoding, but it should be noted that the invention is not limited to turbo decoding.

It has been realised that soft-bits may be divided into different types, having different relative reliabilities, and that the different types of soft-bits may vary as to how easy they are to decode on average, e.g. how many iterations of the decoder may be needed for decoding. This is particularly the case with high order modulations such as QAM16 and QAM64 due to the way bits are mapped onto a constellation. When decoding, not all the de-mapped soft-bits have the same quality and reliability. For example, in QAM64 where 6 bits are used to specify a position in the constellation according to the WCDMA/HSPDA standard, soft-bits 0/1 are on average the most reliable (i.e. have a relatively higher average absolute value), soft-bits 2/3 have on average medium reliability and soft-bits 4/5 are on average least reliable (i.e. have a relatively lower average absolute value). In this respect, there are thus three different types of soft-bits generated in QAM64. The algorithm, such as an HARQ algorithm, which selects soft-bits for transport-block partitioning (segmentation) into code-blocks and the interleaving, is determined by the standards and is not optimal. In an ideal case, each code-block should have a similar proportion of most-reliable, medium-reliable and least-reliable soft-bits (for the QAM64 example). This would make the probability of correct decoding of a code-block similar for each code block. If some code-blocks get higher proportions of least-reliable soft-bits, they may be more likely to fail decoding and as consequence, the whole transport block may fail decoding, as determined e.g. by a cyclic redundancy check (CRC), and may have to be re-transmitted completely or partly. Unfortunately, the HARQ algorithm, e.g. depending on transport block size and coding rate, is not segmenting most, medium and least reliable soft-bits evenly between the code-blocks of a received transport block. In certain cases, received code-blocks have up to 50% more least-reliable soft-bits than the most-reliable ones, and vice versa. Such transport blocks are more difficult to decode compared to if the different types of soft-bits are distributed evenly between the code blocks of the transport block, since the ease with which a transport block is decoded is decided by the most difficult code block. If QAM16 is used, e.g. according to the WCDMA/HSPDA standard, there are only four bits used to specify a position in the constellation, two of which have a higher reliability than the other two. For QAM16 there are thus only two types of soft-bits in this respect. For modulations even higher than QAM64, even more types of soft-bits than the three types of QAM64 may occur. It has been realised that the present invention may be more advantageous for communication signals with a relatively high modulation as discussed above. For instance the method of the present invention may preferably relate to a case where the communication signal, e.g. a wireless communication signal, is modulated using quadrature amplitude modulation 16 (QAM16) or higher, such as QAM64, QAM128 or QAM256.

The communication signal may be of any wireless or wired communication standard where a transport block may be segmented into at least two code blocks for decoding, but it may be convenient to use a standard which allows relatively high modulation, as discussed above. Current standards that may benefit from the present invention include, but are not limited to, the wideband code division multiple access (WCDMA), e.g. WCDMA high speed (HS), or any 3GPP technology standards, but it is envisioned that also future standards may benefit from the present invention, especially since there is a trend of allowing higher and higher modulations.

The transport block may be any transport block, such as a via wire or wirelessly received transport block, of any size, but since a larger transport block needs to be segmented into more code blocks (depending on the maximum size of code blocks set by e.g. the standard or the decoder) and also may have a higher coding rate, it may be more problematic to decode a large transport block. Also, if the decoding is unsuccessful, the whole transport block may need to be re-sent, depending on the communication standard, which of course is a graver problem if the transport block is large. Specifically, the transport block size may be as observed in high speed (HS) data. The present invention may thus be more advantageous when used with larger transport blocks, such as having a size of at least 25000 transmitted bits, at least 30000 bits, at least 35000 bits or at least 40000 bits, but it should be noted, as discussed above, that the invention may be advantageous for all transport blocks which are segmented into at least two code blocks, such as a transport block of at least 5115 transmitted bits since the maximum code block size in WCDMA HS is 5114 bits.

As mentioned above, a larger transport block implies that the transport block may need to be segmented into a plurality of code blocks, e.g. according to the WCDMA/HSPDA standard. In analogy with the discussion above relating to transport block size, the present invention may be advantageous when used with a transport block which is segmented into at least two code blocks, but might be more advantageous for a transport block which is segmented into even more code blocks prior to decoding, such as at least three code blocks, at least four code blocks, at least five code blocks, at least six code blocks, at least seven code blocks, at least eight code blocks or at least nine code blocks.

An assumption is made about how many decoder iterations should be used for different code blocks of a transport block. This assumption may e.g. be a specific number of iterations for each of the code blocks of a transport block, or be a more general indication such as that at least a certain (specified) number of iterations should be used or that more or less iterations should be used compared to an average number of iterations. Often, the total number of iterations available for decoding a transport block is fixed or at least limited to a certain number of iterations. It may thus not be always possible to allocate all the iterations needed, according to the assumptions made, for each of the code blocks, why the assumptions may provide an indication of how many iterations should be allocated for a code block in relation to other code blocks of the same transport block, e.g. a first code block needs more iterations than a second code block but fewer iterations than a third code block, rather than decreeing how many iterations will in fact be used for each code block by the decoder.

The assumption is made based on a study of code block soft-bits. The soft-bits studied may be the actual soft-bits of the code blocks to be decoded, i.e. the soft bits of the code blocks of the transport block are studied in real time after/during reception of the transport block but before its decoding. Thus, the pre-decoding processing unit of a device of the present invention may comprise a soft-bit studying apparatus or function. Additionally or alternatively, the soft-bits studied may be soft-bits of other, real or simulated, transport block(s) having similar properties as the transport block to be decoded. These properties may e.g. be size of (number of bits of) the transport block, coding rate of the transport block, modulation used, communication technology standard used, number of codes used for the transport block etc.

It has been realised that transport blocks having similar properties are often segmented into code blocks in similar ways such that the distributions of different types of soft-bits over the different code blocks of a transport block are the same or similar for all the similar transport blocks. Different distributions are especially seen between transport blocks being segmented into different numbers of code blocks, but differences may also be seen between different transport blocks being segmented into the same number of code blocks but having different sizes. If e.g. the first code block of a first transport block has a soft-bit mixture that makes it particularly difficult to decode, a second, similar, transport block will likely also give rise to a first code block which is equally difficult to decode. This appears to be due to how the segmentation algorithm, such as an hybrid automatic repeat request (HARQ) algorithm, functions. It may thus be possible to correlate studies made on other transport block soft-bits (real or simulated, not from the transport block to be decoded) to the code blocks of the transport block to be decoded, provided that the other transport block is sufficiently similar to the transport block to be decoded. This allows for the advance preparation of look-up tables for different transport blocks, which look-up tables may e.g. be pre-programmed into the device for decoding the code blocks. A look-up table for a transport block corresponding to the transport block to be decoded may e.g. specify, for each of the code blocks of the transport block, how many iterations are assumed to be needed for decoding each of the code blocks or specify a ranking of the code blocks in respect of which code block(s) will likely need more iterations than other code block(s), or otherwise provide information about how easy each of the code blocks is to decode in relation to the other code blocks of the transport block. It may not be convenient to prepare look-up tables for all possible transport blocks, since the many different properties combinations possible might lead to a look-up table too large to handle effectively, in which case extrapolation based on the most similar transport blocks of the look-up table may be used.

The method of the present invention may thus be such that the assumption is made by using a look-up table. The look-up table may e.g. specify presumed numbers of iterations needed for decoding, or the relative presumed difficulty of decoding, different code blocks of transport blocks having different sizes and/or coding rates. The number of iterations needed are presumed, or the relative difficulty is presumed, based on a presumed distribution of different types of soft-bits in the different code blocks. Correspondingly, the device of the present invention may be such that the pre-decoding processing unit is configured to make the assumption by using such a look-up table. The pre-decoding processing unit may thus comprise a look-up table apparatus or function which, based on the properties of the received transport block, consults the appropriate look-up table and obtains the presumed number of iterations needed, or relative difficulty, for each of the code blocks of the received transport block. If presumed numbers of iterations are obtained, they may then be forwarded to the decoder, e.g. by a forwarding apparatus or function of the pre-decoding processing unit. If the relative difficulty is obtained from the look-up table, the pre-decoding processing unit may use this relative information to allocate numbers of iterations for each of the different code blocks in view e.g. of the total number of iterations allowed for the transport block and/or in view of other parameters for the decoding of the transport block. The allocated number of iterations for the different code blocks may then be forwarded to the decoder as discussed above. The different look-up tables needed for the different received transport blocks may be stored in the inventive device, such as in a storage unit in the pre-decoding processing unit or outside of the pre-decoding processing unit.

Additionally or alternatively to the use of a look-up table, the soft bits of the received transport block may be studied directly. By studying the distribution of different types of soft-bits in the different code blocks of the transport block, the assumption about how many iterations are needed for each code block may be made individually for the received transport block. This may be a more accurate way of making the assumption than by relying on a look-up table based on a similar but other transport block. However, using a look-up table may reduce the computational burden on the inventive device as well as the energy consumption. One way of directly studying the distribution of different types of soft-bits in the different code blocks of the transport block is to determine the average absolute soft-bit value or, similarly, to determine the average soft-bit amplitude, of the different code blocks of the transport block to be decoded. A high average soft-bit value, or a high average soft-bit amplitude of a code block indicates that the code block probably has a high proportion of most reliable soft-bits. By comparing the average values of the code blocks with each other, conclusions can be drawn as to the distribution of different types of soft-bits in the different code blocks, whereby the assumption of the present invention may be made based on this. Thus, the method of the present invention may be such that the assumption may be made based on measurements of average absolute soft-bit value on each of the different code blocks to be decoded. Also, the device of the present invention may be such that the pre-decoding processing unit is configured to make the assumption based on measurements of average absolute soft-bit value on each of the different code blocks to be decoded. Alternatively to the average absolute soft-bit value, other similar measurements of the soft-bit value may be used in a corresponding way, e.g. the average squared soft-bit value.

An additional or alternative way of studying code block soft-bits of a transport block is to run a simulation of a segmentation of soft-bits to code blocks from a transport block having the same properties as the transport block to be decoded. Since the segmentation algorithm, as discussed above, will likely distribute different types of soft-bits over the code blocks similarly for all transport blocks having essentially the same properties, a simulation may be as accurate as studying the transport block to be decoded directly, or at least sufficiently accurate. Thus, the inventive method may be such that the assumption is made based on a simulated distribution of different soft-bits in the different code blocks to be decoded. Also, the inventive device may be such that the pre-decoding processing unit is configured to make the assumption based on a simulated distribution of different soft-bits in the different code blocks to be decoded.

The received transport block may be decoded using different numbers of decoder iterations for the different code blocks. This implies that a decoder with a capability for using variable number of iterations for different code blocks is used, i.e. the number of iterations per code block is not fixed but are instead different for different code blocks depending on how difficult it is to decode, or how difficult it is assumed to decode, the respective code blocks. The different number of iterations may be allocated to the different code blocks of the received transport block prior to the decoding of the transport block such that the number of iterations for each code block is fixed prior to decoding. Alternatively, only a maximum number of iterations per code block is fixed, wherein the maximum number may be the same for all of the code blocks of the transport block or there may be a specific maximum number of iterations set for each code block, which specific maximum number may be different for different code blocks, and less than the maximum number of iterations may be used for a code block if it is determined, e.g. by a cyclic redundancy check (CRC), that the code block has been decoded correctly using only the less than maximum number of iterations. This may be made possible by including an early exit function in the decoder. The non-used iterations may then be used for decoding subsequent code blocks which may need more iterations than the maximum number of iterations allocated to them. Typically, a maximum number of total iterations may be set per transport block and the allocation of iterations to the different code blocks of the transport block may be made such that the maximum number for the transport block is not surpassed by the sum of the allocations of iterations or maximum iterations made to each of the code blocks of the transport block. However, it is also contemplated that the maximum number of total iterations set per transport block is dynamic or that it may be allowed to surpass it, e.g. if a previously decoded transport block used less than the maximum number of total iterations allocated to it. It may be convenient in some applications of the present invention to not use all iterations allocated to the transport block, for saving power, if adequate decoding may be obtained also without using the maximum number of total iterations. The decoder of the device of the present invention may thus comprise an apparatus or function for variable number of iterations per code block.

The different numbers of decoder iterations allocated for the different code blocks may be at least partly based on the made assumption about how many decoder iterations should be used for the different code blocks. The decoder iterations available for the decoding of the received transport block may be allocated to the different code blocks of the transport block in accordance with the assumption made. As discussed above, the assumption may include a specific number of iterations for each of the code blocks, or the assumption may be more general. Even if the assumption includes specific numbers of iterations, these numbers of iterations might not be allocated to the different code blocks. The total number of iterations available for the decoding of the transport block may e.g. be too few to allow the allocations proposed by the assumption, or the available total number of iterations may be more why the additional available iterations may be allocated in addition to the allocations proposed by the assumption. Alternatively, the allocation of iterations proposed by the assumption is followed, at least if possible. If the assumption is of a more general nature, such as indicating that some code block(s) are likely more difficult to decode than other code block(s), the available iterations for decoding the transport block may be allocated accordingly by e.g. allocating more iterations for the decoding of the more difficult code blocks and less iterations for the decoding of the less difficult code blocks. The code blocks may e.g. be divided into two, three or more groups depending on how difficult they are assumed to be to decode, i.e. the assumption about how many iterations should be used for the different code blocks, and the iterations available for the decoding of the transport block may be allocated to the different code blocks accordingly with more iterations allocated to the more difficult code blocks etc.

In addition to, or as an alternative to, allocating numbers of iterations, or maximum numbers of iterations, to each of the code blocks of the transport block, the decoder may be configured to choose the order in which it decodes the code blocks based on the assumption made as to how many iterations the different code blocks will need. Thus, the decoder may e.g. start decoding the code block(s) having the smallest number of assumed iterations. These will likely then decode in only a few iterations, allowing the code blocks having larger number of assumed iterations to be decoded using a larger number of iterations than the average number of iterations per code block allowed in view of the maximum total number of iterations allowed for the transport block. The decoder of the inventive device may thus comprise a code block order apparatus or function allowing it to choose the order in which it decodes the code blocks, which choice may be made based on the assumption made as to the number of iterations needed to decode each of the different code blocks of the received transport block, e.g. the assumption as to how relatively difficult each of the code blocks likely is to decode. This code block order function may preferably be combined with the early exit function discussed above. Specific numbers, or maximum numbers, of iterations may then not have to be allocated to each of the different code blocks, since the iteration of a code block will stop automatically when that code block is determined to have been decoded sufficiently. Thus, the decoding may e.g. be started with the code block(s) having the least assumed iterations needed, and when the code block has decoded sufficiently, probably after only a few iterations, the next code block may be decoded. The code block(s) having the most assumed iterations needed may be left for decoding last, when the spare iterations left over from the more easily decoded code blocks may be used to increase the number of iterations for decoding the more difficultly decoded code blocks. Thus, the use of the total number of iterations available for decoding of the transport block may be optimised, allowing most of or all of the iterations to be used since early exit is less likely for the last code block of the transport block to be decoded as it is assumed to be difficult, conveniently the most difficult, to decode. The inventive method may thus be such that the decoding comprises first decoding a code block of the different code blocks for which the lowest number of iterations is assumed, and then decoding a code block of the different code blocks for which a higher number of iterations is assumed. Correspondingly, the inventive device may be such that the decoder is configured to first decode a code block of the different code blocks for which the lowest number of iterations is assumed, and then decode a code block of the different code blocks for which a higher number of iterations is assumed.

Figure 1:
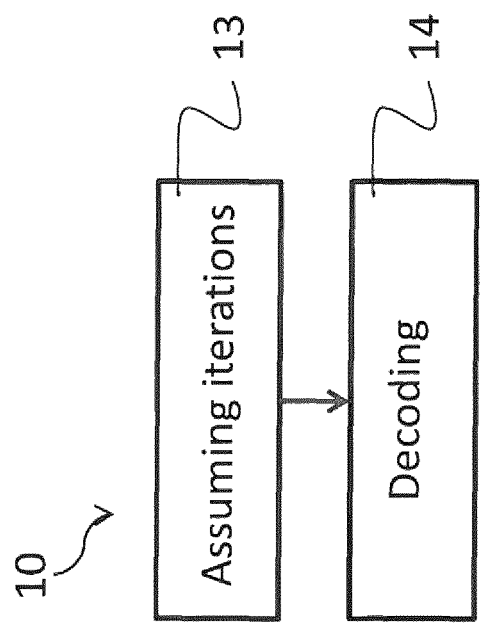
FIG. 1 is a schematic process chart of an embodiment of a method of the present invention.

FIG. 1 illustrates an embodiment 10 of a method of the present invention. The method may be performed by a device of the present invention.

An assumption 13 is made regarding how many decoder iterations should be used for different code blocks of a transport block when decoding said transport block. This assumption 13 may e.g. be a specific number of iterations for each of the code blocks of a transport block, or be a more general indication such as that at least a certain (specified) number of iterations should be used or that more or less iterations should be used compared to an average number of iterations. Often, the total number of iterations available for decoding a transport block is fixed or at least limited to a certain number of iterations. It may thus not be always possible to allocate all the iterations needed, according to the assumption 13 made, for each of the code blocks, why the assumption 13 may provide an indication of how many iterations should be allocated for a code block in relation to other code blocks of the same transport block, e.g. a first code block needs more iterations than a second code block but fewer iterations than a third code block, rather than decreeing how many iterations will in fact be used for each code block by the decoder. The assumption 13 is made based on a study of code block soft-bits. The soft-bits studied may be the actual soft-bits of the code blocks to be decoded, i.e. the soft bits of the code blocks of the transport block are studied in real time after/during reception of the transport block but before its decoding. Thus, the pre-decoding processing unit of a device of the present invention may comprise a soft-bit studying apparatus or function. Additionally or alternatively, the soft-bits studied may be soft-bits of other, real or simulated, transport block(s) having similar properties as the transport block to be decoded. These properties may e.g. be size of (number of bits of) the transport block, coding rate of the transport block, modulation used, communication technology standard used, number of codes used for the transport block etc.

The transport block is decoded 14 by using different number of decoder iterations for the different code blocks of the transport block. The number of iterations used for each code block is at least partly based on the assumption 13 previously made as discussed above. The received transport block may thus be decoded using different numbers of decoder iterations for the different code blocks as discussed above.

FIG. 2 illustrates another embodiment 20 of a method of the present invention. The method 20 may be a more specific embodiment of the method 10 discussed above.

A transport block to be decoded is received 21. The transport block may be any transport block as discussed above. The transport block is then segmented 22 into a plurality of code blocks, typically in accordance with the communication standard used for the transport block. An assumption 13 is then made regarding how many decoder iterations should be used for different code blocks of a transport block when decoding said transport block. The assumption 13 may be in accordance with the discussion above regarding FIG. 1. The transport block is finally decoded 14 by using different number of decoder iterations for the different code blocks of the transport block. Also the decoding 14 may be in accordance with the discussion above and in respect of FIG. 1.

Figure 3:
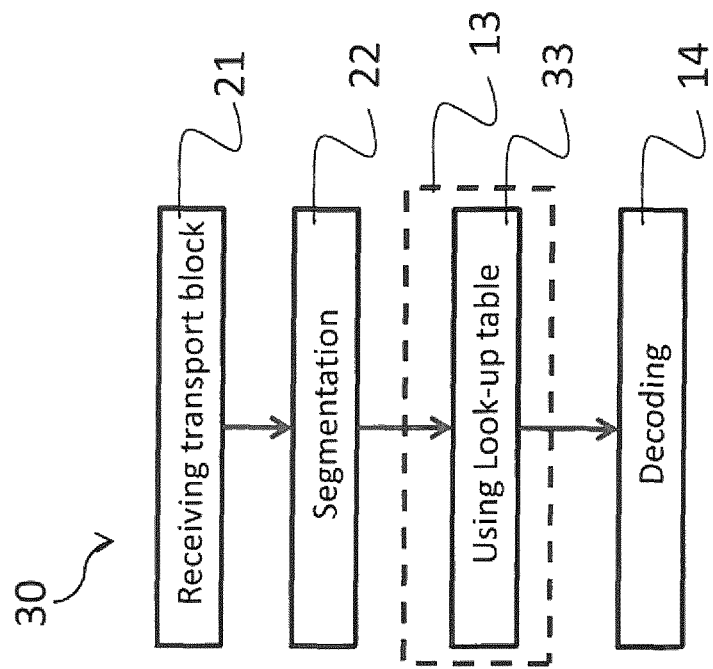
FIG. 3 is a schematic process chart of another embodiment of a method of the present invention.

FIG. 3 illustrates another embodiment 30 of a method of the present invention. The method 30 may be regarded as a more specific embodiment of the method 20 discussed above. What differs from the method 20 is that the assumption 13 includes the use 33 of a look-up table. The look-up table may be used, produced and pre-programmed as discussed above. Using 33 a look-up table is one convenient way of making an assumption 13 about how many decoder iterations should be used for the different code blocks.

Figure 4:
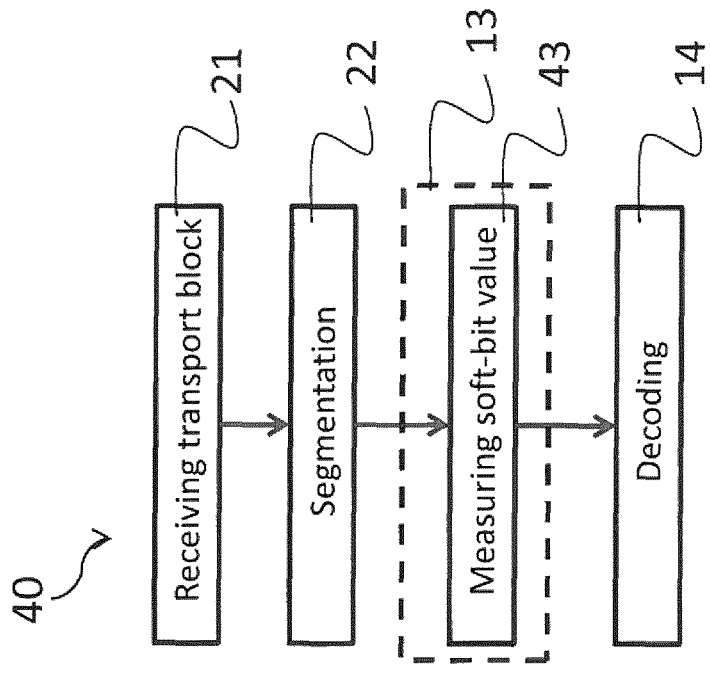
FIG. 4 is a schematic process chart of another embodiment of a method of the present invention.

FIG. 4 illustrates another embodiment 40 of a method of the present invention. The method 40 may be regarded as a more specific embodiment of the method 20 discussed above. What differs from the method 20 is that the assumption 13 includes measuring 43 the average absolute soft-bit value of the different code blocks to be decoded. As discussed above, the average absolute soft-bit value may be an indication of the distribution of the different types of soft-bits (i.e. soft-bits of different reliability) in the different code blocks. Based on the absolute soft-bit value, the assumption 13 may thus be made.

FIG. 5 illustrates another embodiment 50 of a method of the present invention. The method 50 may be regarded as a more specific embodiment of the method 20 discussed above. What differs from the method 20 is that the assumption 13 includes simulating 53 the distribution of the different types of soft-bits (i.e. soft-bits of different reliability) in the different code blocks to be decoded. As discussed above, similar transport blocks are segmented in similar ways every time, why it is possible to simulate 53 the soft-bit distribution of a received transport block and arrive at, or close to, the real distribution, without actually having to study the real soft-bit distribution of the code blocks. Based on the simulation 53, the assumption 13 may thus be made.

FIG. 6 illustrates in more detail how the decoding 14 may be performed by means of a decoding method performed by the decoder. The decoder method may include early exit, allowing the decoding of a code block to be stopped when it has been determined that the code block has been sufficiently decoded. Iterations not needed for decoding the code block may then be used for decoding other, later and possibly more difficult, code blocks, or energy may be saved by using fewer total iterations for decoding the transport block. Thus, an iteration 61 is used for decoding a first code block of the transport block. After the iteration 61 a check 62 is performed in order to determine whether the code block has been sufficiently decoded. This check may be e.g. by means of a cyclic redundancy check, or by means of TDEC metrics. If it is decided that the code block is not sufficiently decoded, another iteration 61 is performed on the code block. This is continued until the check 62 determines that the code block has been sufficiently decoded, or until a maximum number of iterations 61 for the code block has been reached. If it is determined that the code block is sufficiently decoded, or the maximum number of iterations 61 is reached, the decoder stops working on the first code block and instead performs iterations 63 on a second code block of the transport block. This procedure is then continued until all the code blocks of the transport block have been processed by the decoder.

FIG. 7 illustrates another embodiment 70 of a method of the present invention. The method 70 may be regarded as a more specific embodiment of the method 20 discussed above. What differs from the method 20 is that early exit is used for the decoding 14 of the transport block, e.g. in accordance with the method of FIG. 6, and that information is stored 74 about for which code blocks early exit was used. This may mean that information is stored 74 which indicates which code blocks were easy enough to decode that early exit could be used and which code blocks were more difficult to decode that the maximum number of iterations were used instead of early exit. This stored 74 information may then be used for allocating iterations to the different code blocks of the transport block if the transport block is re-sent due to failure to decode the transport block. More iterations may be allocated to code blocks where early exit was not used, and for this iterations may be taken from the code blocks where early exit was used. Where early exit was used, information may also be stored regarding after how many iterations early exit was used. This may allow no more iterations to be allocated to these code blocks than needed, maximising the number of iterations for the code blocks where early exit was not used.

FIG. 8 illustrates in more detail another way of how the decoding 14 may be performed by means of a decoding method performed by the decoder. The decoder method may include early exit, allowing the decoding of a code block to be stopped when it has been determined that the code block has been sufficiently decoded. Iterations not needed for decoding the code block may then be used for decoding other, later and possibly more difficult, code blocks, or energy may be saved by using fewer total iterations for decoding the transport block. Since the assumption 13 has been made the code blocks may be arranged in order of difficulty in respect of decoding. thus, a code block easy to decode may be decoded first. The early exit function may then stop the decoding of the easy code block, allowing more iterations to be for later code blocks which are more difficult to decode. Thus, an iteration 81 is used for decoding an easy code block of the transport block. After the iteration 81 a check 62 is performed in order to determine whether the easy code block has been sufficiently decoded. This check may be e.g. by means of a cyclic redundancy check, or by means of TDEC metrics. If it is decided that the code block is not sufficiently decoded, another iteration 81 is performed on the code block. This is continued until the check 62 determines that the code block has been sufficiently decoded, or until a maximum number of iterations 81 for the code block has been reached. If it is determined that the code block is sufficiently decoded, or the maximum number of iterations 81 is reached, the decoder stops working on the easy code block and instead performs iterations 83 on a more difficult code block of the transport block. This procedure is then continued until all the code blocks of the transport block have been processed by the decoder.

Figure 9:
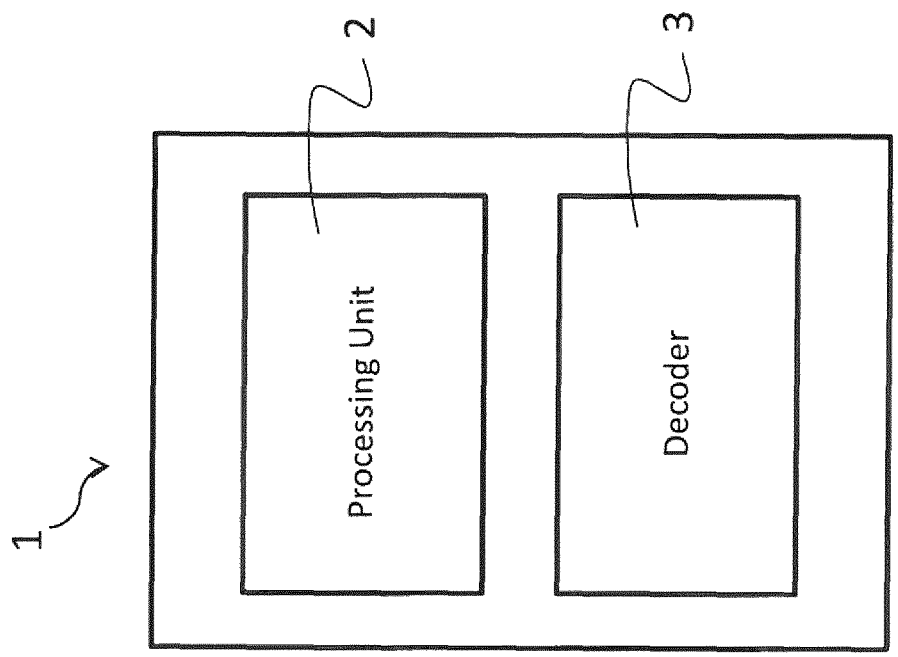
FIG. 9 is a schematic diagram of an embodiment of a device of the present invention.

FIG. 9 illustrates an embodiment of a device 1 for decoding code blocks of a transport block. The device 1 comprises a pre-decoding processing unit 2. The pre-decoding processing unit 2 is configured to make an assumption 13 about how many decoder iterations should be used for different code blocks of the code blocks of the transport block, wherein the assumption is made based on a study of code block soft-bits. The device 1 also comprises a decoder 3. The decoder 3 is configured to decode the transport block using different numbers of decoder iterations for the different code blocks. The different number of decoder iterations are based on the made assumption 13 about how many decoder iterations should be used for the different code blocks made by means of the pre-decoding processing unit 2.

Figure 10:
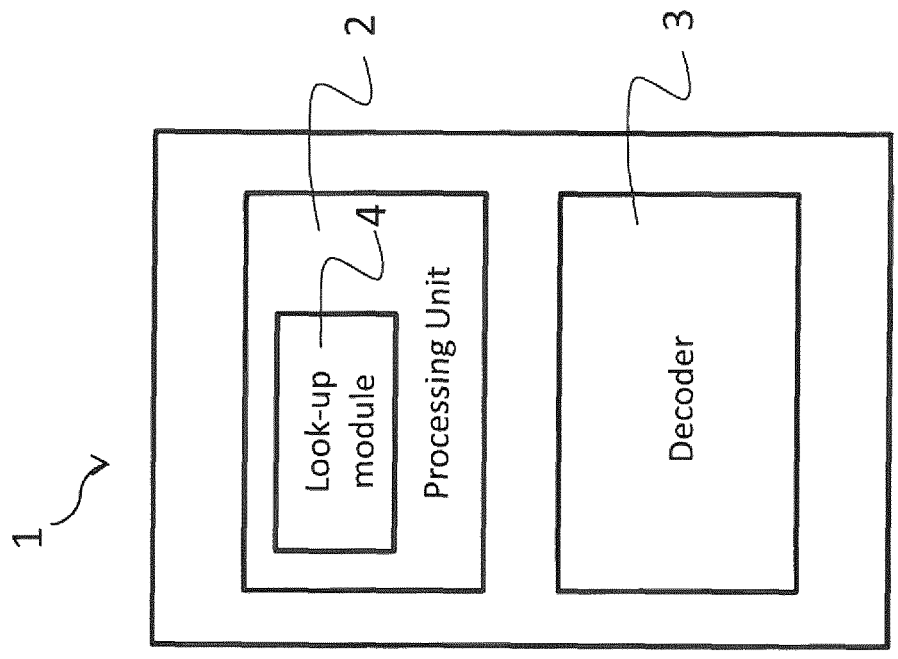
FIG. 10 is a schematic diagram of another embodiment of a device of the present invention.

FIG. 10 illustrates another embodiment of a device 1 for decoding code blocks of a transport block. According to this embodiment, the pre-decoding processing unit 2 comprises a look-up module 4 configured with circuitry for enabling the pre-decoding processing unit 2 to use a look-up table as discussed above for making the assumption 13.

Figure 11:
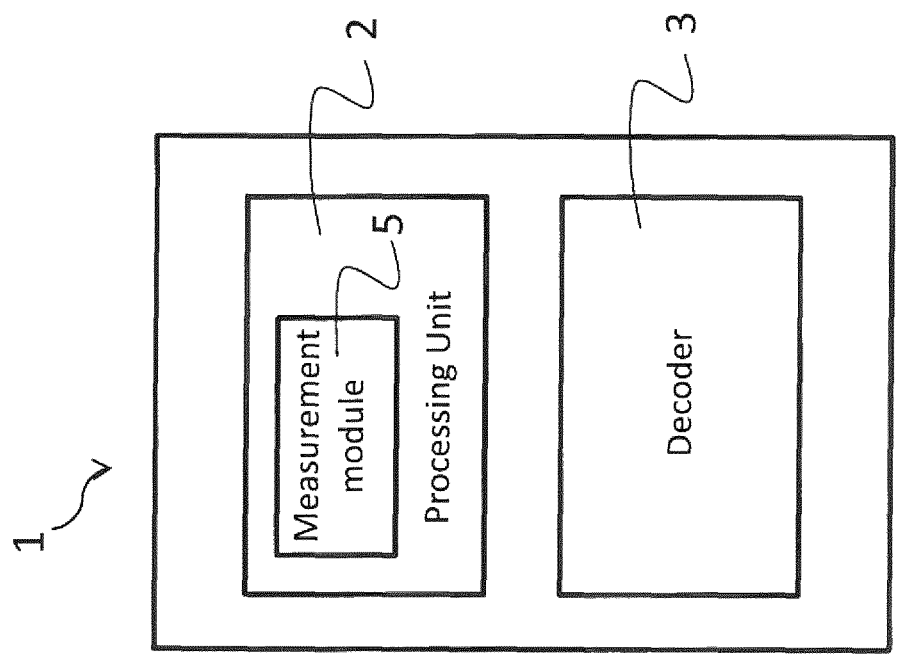
FIG. 11 is a schematic diagram of another embodiment of a device of the present invention.

FIG. 11 illustrates another embodiment of a device 1 for decoding code blocks of a transport block. According to this embodiment, the pre-decoding processing unit 2 comprises a measurement module 5 configured with circuitry for performing a measurement of the average absolute soft-bit value of the different code blocks of the transport block to be decoded as discussed above. This measurement module 5 thus enables the pre-decoding processing unit 2 to make the assumption 13 based on average absolute soft-bit value of the different code blocks as discussed above.

Figure 12:
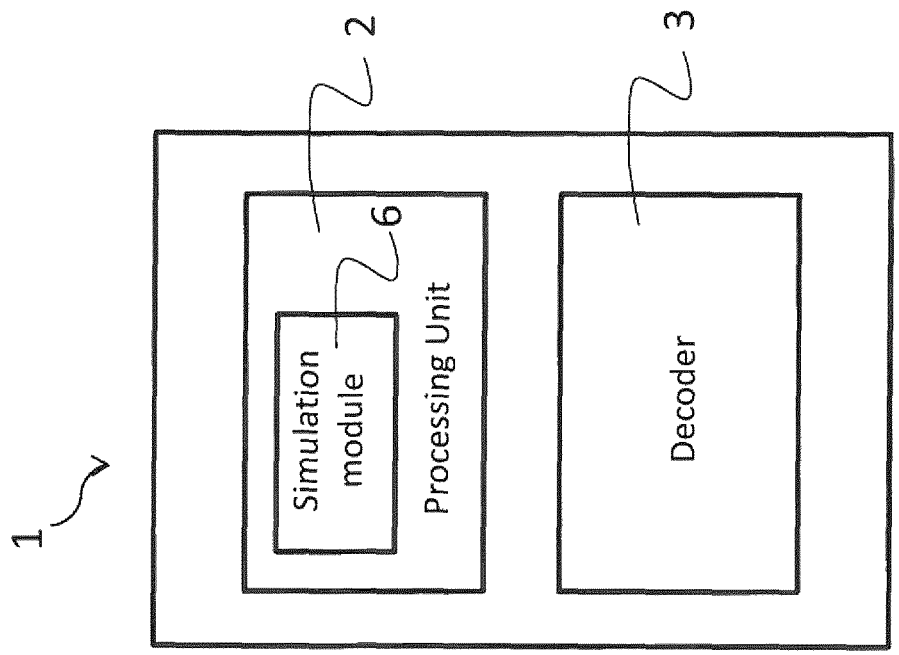
FIG. 12 is a schematic diagram of another embodiment of a device of the present invention.

FIG. 12 illustrates another embodiment of a device 1 for decoding code blocks of a transport block. According to this embodiment, the pre-decoding processing unit 2 comprises a simulation module 6 configured with circuitry for performing a simulation of the distribution of the different types of soft-bits of a transport block in different code blocks as discussed above. This simulation module 6 thus enables the pre-decoding processing unit 2 to make the assumption 13 based on this simulation as discussed above.

Figure 13:
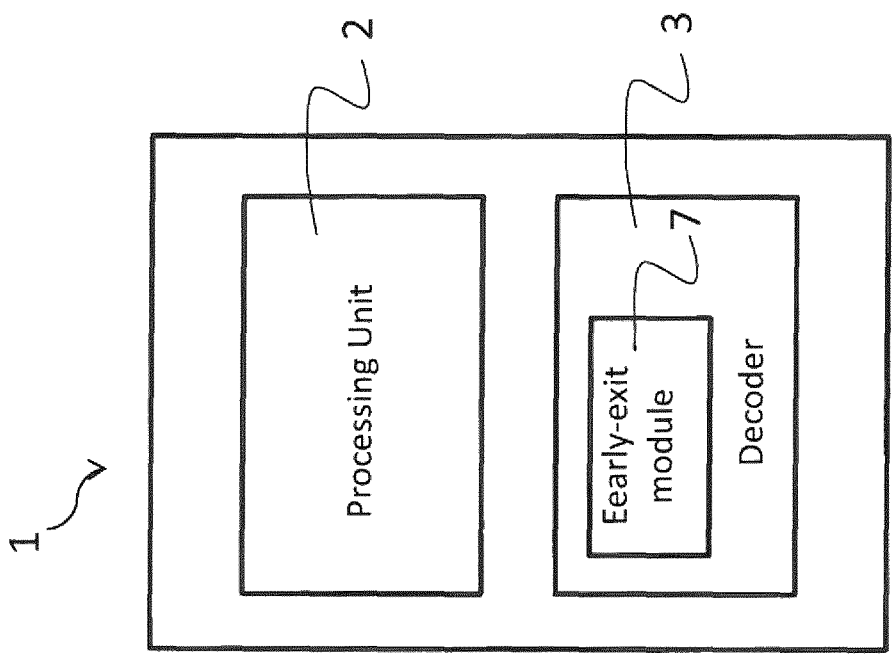
FIG. 13 is a schematic diagram of another embodiment of a device of the present invention.

FIG. 13 illustrates another embodiment of a device 1 for decoding code blocks of a transport block. According to this embodiment, the decoder 3 comprises an early-exit module 7 configured with circuitry for enabling early-exit in the decoding of the different code blocks by means of the decoder 3, as discussed above.

Figure 14:
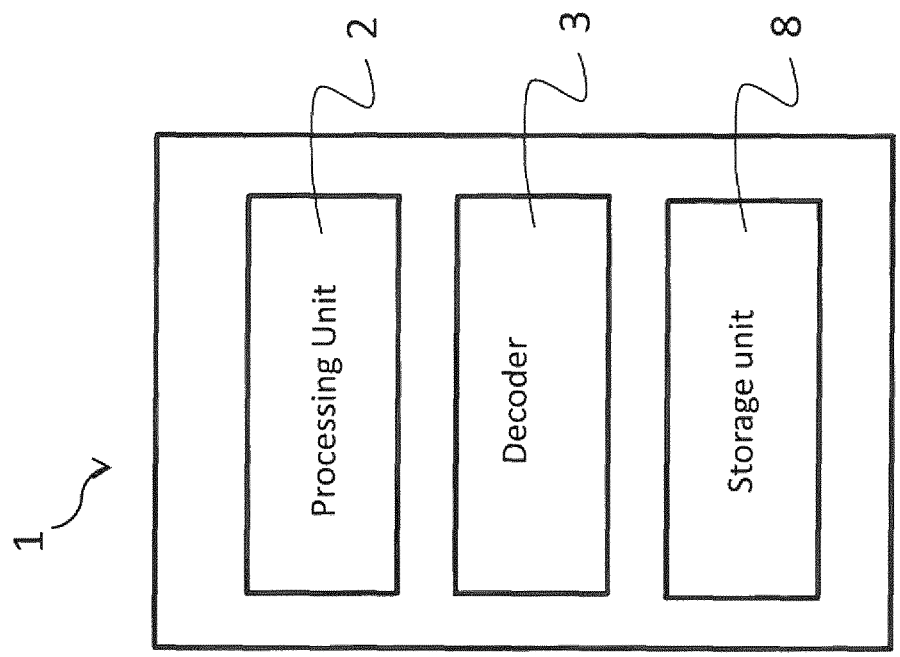
FIG. 14 is a schematic diagram of another embodiment of a device of the present invention.

FIG. 14 illustrates another embodiment of a device 1 for decoding code blocks of a transport block. According to this embodiment, the device 1 also comprises a storage unit 8 configured with circuitry to store information about for which code blocks an early-exit function is used for exiting the decoding of a code block early. This storage unit 8 enables the device 1 to use this information for allocating decoder iterations in case of a re-transmission of the transport block or individual code blocks, as discussed above.

FIG. 15 illustrates an embodiment of a transmit-receive unit 100. The transmit-receive unit 100 comprises a transmitter 101, a receiver 102 and a decoding device 1, such as the decoding device 1 discussed in any of the FIGS. 9-14. The receiver 102 may be any suitable receiver, such as receiver of radio signals, and may be associated with an antenna. The receiver 102 may be configured with circuitry to receive transport blocks, such as transport blocks discussed herein. The receiver 102 may be configured with circuitry to provide received transport blocks to the decoding device 1 for decoding as described herein. The transmitter 101 may be any suitable transmitter, such as transmitter of radio signals, and may be associated with an antenna, possibly the same antenna as associated with the receiver. The transmitter 101 may be configured with circuitry to transmit transport blocks, such as transport blocks discussed herein. The receiver 102 and the transmitter 101 may be combined in a transceiver.

Example 1

Table 1, below, presents soft-bit distribution within code-blocks in case of HSDPA 15-code QAM64 transport block (total soft-bit buffer is 43200 bits). Between 6 and 9 code-blocks are present for transport block sizes between 25000 and 42192 bits. Difficult code blocks (which have high percentage of least-reliable soft-bits) are marked with a "+" sign in the top right corner in the table, while easy ones (which have high percentage of most-reliable soft-bits) are marked with a "−" sign in the top right corner in the table. Code blocks with neither a "+" or "−" are code blocks with approximately even distribution of reliable/unreliable soft-bits. The number of most/medium/least-reliable soft-bits in each code block is shown.

TABLE 1

Distribution of different types of soft-bits (most, medium and least reliable) in the different code blocks of transport blocks of different sizes. HSDPA 15-code QAM64. Soft-bit buffer 43200 bits.

| trBLK: | | 25000 | 26000 | 27000 | 28000 | 29000 | 30000 | 31000 |
|---|---|---|---|---|---|---|---|---|
| Code Blk 1 | Most | 2505 + | 2172 + | 2254 + | 2338 | 2296 + | 2004 + | 1775 + |
| | Mid | 2504 | 2170 | 2254 | 2337 | 2294 | 2003 | 1774 |
| | Least | 3631 | 2858 | 2692 | 2525 | 2610 | 3193 | 2623 |
| Code Blk 2 | Most | 2505 + | 2170 + | 2254 + | 2338 | 2420 | 2380 | 1775 + |
| | Mid | 2629 | 2172 | 2254 | 2337 | 2422 | 2381 | 1774 |
| | Least | 3507 | 2858 | 2692 | 2525 | 2358 | 2439 | 2622 |
| Code Blk 3 | Most | 2712 | 2172 + | 2254 + | 2337 | 2422 | 2504 − | 1978 |
| | Mid | 3507 | 2170 | 2254 | 2338 | 2420 | 2504 | 1980 |
| | Least | 2420 | 2858 | 2692 | 2525 | 2358 | 2192 | 2214 |
| Code Blk 4 | Most | 3339 − | 2170 | 2254 + | 2337 | 2420 | 2504 − | 2218 − |
| | Mid | 2880 | 3015 | 2254 | 2338 | 2422 | 2504 | 2218 |
| | Least | 2422 | 2015 | 2692 | 2525 | 2358 | 2192 | 1735 |
| Code Blk 5 | Most | 3339 − | 2822 − | 2379 − | 2338 | 2422 | 2504 − | 2218 − |
| | Mid | 2880 | 2473 | 2984 | 2337 | 2420 | 2504 | 2218 |
| | Least | 2420 | 1905 | 1837 | 2525 | 2358 | 2192 | 1736 |
| Code Blk 6 | Most | | 2894 − | 3005 − | 2712 − | 2420 | 2504 − | 2218 − |
| | Mid | | 2400 | 2400 | 2713 | 2422 | 2504 | 2218 |
| | Least | | 1906 | 1795 | 1775 | 2358 | 2192 | 1735 |
| Code Blk 7 | Most | | | | | | | 2218 − |
| | Mid | | | | | | | 2218 |
| | Least | | | | | | | 1735 |

| trBLK: | | 32000 | 33000 | 34500 | 35798 | 37000 | 38200 |
|---|---|---|---|---|---|---|---|
| Code Blk 1 | Most | 1832 + | 1890 + | 1975 + | 1794 | 1544 + | 1594 + |
| | Mid | 1832 | 1888 | 1974 | 1792 | 1544 | 1594 |
| | Least | 2508 | 2394 | 2223 | 1814 | 2312 | 2212 |
| Code Blk 2 | Most | 1832 + | 1888 + | 1975 + | 1792 | 1740 + | 1594 + |
| | Mid | 1831 | 1890 | 1974 | 1794 | 1739 | 1594 |
| | Least | 2508 | 2393 | 2222 | 1814 | 1921 | 2212 |
| Code Blk 3 | Most | 1832 + | 1889 + | 1974 + | 1793 | 1852 | 1648 + |
| | Mid | 1831 | 1888 | 1975 | 1792 | 1853 | 1648 |
| | Least | 2508 | 2395 | 2223 | 1815 | 1695 | 2104 |
| Code Blk 4 | Most | 2036 | 1889 + | 1974 + | 1793 | 1854 | 1914 − |
| | Mid | 2037 | 1889 | 1975 | 1793 | 1852 | 1912 |
| | Least | 2100 | 2393 | 2222 | 1814 | 1694 | 1574 |
| Code Blk 5 | Most | 2290 − | 2122 | 1974 + | 1792 | 1852 | 1912 − |
| | Mid | 2289 | 2123 | 1974 | 1793 | 1854 | 1914 |
| | Least | 1592 | 1927 | 2224 | 1815 | 1694 | 1574 |
| Code Blk 6 | Most | 2289 − | 2362 − | 2060 | 1794 | 1853 | 1913 − |
| | Mid | 2290 | 2360 | 2060 | 1792 | 1852 | 1912 |
| | Least | 1592 | 1449 | 2051 | 1814 | 1695 | 1575 |
| Code Blk 7 | Most | 2289 − | 2360 − | 2468 − | 1792 | 1853 | 1913 − |
| | Mid | 2290 | 2362 | 2468 | 1794 | 1853 | 1913 |
| | Least | 1592 | 1449 | 1235 | 1814 | 1694 | 1574 |
| Code Blk 8 | Most | | | | 1850 | 1852 | 1912 − |
| | Mid | | | | 1850 | 1853 | 1913 |
| | Least | | | | 1700 | 1695 | 1575 |

| trBLK: | | 38576 | 39000 | 40000 | 40900 | 41500 | 42192 |
|---|---|---|---|---|---|---|---|
| Code Blk 1 | Most | 1610 + | 1628 + | 1670 + | 1518 + | 1540 + | 1566 + |
| | Mid | 1610 | 1628 | 1669 | 1518 | 1540 | 1565 |
| | Least | 2180 | 2144 | 2061 | 1764 | 1720 | 1669 |

TABLE 1-continued

Distribution of different types of soft-bits (most, medium and least reliable) in the different code blocks of transport blocks of different sizes. HSDPA 15-code QAM64. Soft-bit buffer 43200 bits.

| Code Blk 2 | Most  | 1610 + | 1628 + | 1668 + | 1518 + | 1540 + | 1564 + |
|---|---|---|---|---|---|---|---|
|       | Mid   | 1610   | 1626   | 1669   | 1516   | 1538   | 1565   |
|       | Least | 2180   | 2146   | 2063   | 1766   | 1722   | 1672   |
| Code Blk 3 | Most  | 1610 + | 1626 + | 1670 + | 1516 + | 1538 + | 1566 + |
|       | Mid   | 1609   | 1628   | 1669   | 1518   | 1540   | 1565   |
|       | Least | 2181   | 2146   | 2061   | 1766   | 1722   | 1668   |
| Code Blk 4 | Most  | 1844 − | 1708 + | 1668 + | 1518 + | 1540 + | 1564 + |
|       | Mid   | 1845   | 1706   | 1669   | 1518   | 1540   | 1565   |
|       | Least | 1711   | 1986   | 2063   | 1764   | 1720   | 1672   |
| Code Blk 5 | Most  | 1932 − | 1952 − | 1716 + | 1518 + | 1540 + | 1566 + |
|       | Mid   | 1931   | 1954   | 1716   | 1516   | 1538   | 1565   |
|       | Least | 1537   | 1494   | 1968   | 1766   | 1722   | 1668   |
| Code Blk 6 | Most  | 1932 − | 1953 − | 2003 − | 1516 + | 1538 + | 1564 + |
|       | Mid   | 1931   | 1952   | 2002   | 1518   | 1540   | 1565   |
|       | Least | 1537   | 1495   | 1395   | 1766   | 1722   | 1672   |
| Code Blk 7 | Most  | 1931 − | 1953 − | 2003 − | 1655 − | 1540 + | 1566 + |
|       | Mid   | 1932   | 1953   | 2003   | 1654   | 1540   | 1565   |
|       | Least | 1537   | 1494   | 1394   | 1491   | 1720   | 1668   |
| Code Blk 8 | Most  | 1931 − | 1952 − | 2002 − | 1821 − | 1778 − | 1566 + |
|       | Mid   | 1932   | 1953   | 2003   | 1821   | 1776   | 1567   |
|       | Least | 1537   | 1495   | 1395   | 1158   | 1246   | 1668   |
| Code Blk 9 | Most  |        |        |        | 1820 − | 1846 − | 1878 − |
|       | Mid   |        |        |        | 1821   | 1848   | 1878   |
|       | Least |        |        |        | 1159   | 1106   | 1043   |

Large variations of soft-bit distributions are seen for most of the largest transport formats shown. For example when transport block size is approx. 30000, it can be seen that the first code-block is particularly bad, with large number of least-reliable soft-bits (2004, 2003 and 3193 of most/medium and least reliable soft-bits, respectively), while the remaining code blocks have more most-reliable soft-bits than least-reliable ones. In this particular case, code-block 1 may preferably be processed using much higher turbo decoder iteration counts in order to try to mitigate some of that inefficiency.

In general, it can be seen that the soft-bit distribution inefficiency, changes slowly with transport block size and there are similarities which span over large range of transport block sizes (e.g. for the transport sizes that are segmented into the same number of code blocks). In implementation, it may be possible to treat certain transport block size ranges together. For example, transport block sizes from 29000 to 30684 (with 6 code-blocks) show similar inefficiencies and could share similar turbo decoder (TDEC) iteration characteristics and therefore the algorithm may be implemented as pre-computed lookup tables with TDEC iteration counts per each code-block. With transport block sizes exceeding 30684, the number of code-blocks changes from 6 to 7, and therefore, why they may need to be treated differently than range 29000-30684.

Since easy code-blocks converge faster, they can be assigned a lower number of iterations (without any performance loss), however, more difficult code-blocks generally require more iterations. Performance gains with higher iteration counts are clearly seen. Practical gains will however depend on implementation details such as available number of iterations for all code-blocks of the transport block to be decoded.

Example 2

Table 2, below, presents soft-bit distribution within code-blocks in case of HSDPA 15-code QAM16 transport block (total soft-bit buffer is 28800 bits). Between 3 and 6 code-blocks are present for transport block sizes between 15300 and 28000 bits. Difficult code blocks (which have high percentage of least-reliable soft-bits) are marked with a "+" sign in the top right corner in the table, while easy ones (which have high percentage of most-reliable soft-bits) are marked with a "−" sign in the top right corner in the table. Code blocks with neither a "+" or "−" are code blocks with approximately even distribution of reliable/unreliable soft-bits. The number of most/medium/least-reliable soft-bits in each code block is shown.

TABLE 2

Distribution of different types of soft-bits (most and least reliable) in the different code blocks of transport blocks of different sizes. HSDPA 15-code QAM16. Soft-bit buffer 28800 bits.

| trBLK: |       | 15300  | 15342  | 17800  | 20400  | 20454  |
|---|---|---|---|---|---|---|
| Code Blk 1 | Most  | 5424 − | 4338 − | 4226 − | 3793 − | 3026 − |
|       | Least | 4176   | 2862   | 2974   | 3407   | 2734   |
| Code Blk 2 | Most  | 4488 + | 3354 + | 4227 − | 3793 − | 3027 − |
|       | Least | 5112   | 3846   | 2973   | 3407   | 2733   |
| Code Blk 3 | Most  | 4488 + | 3354 + | 3207 + | 3794 − | 3027 − |
|       | Least | 5112   | 3846   | 3993   | 3406   | 2733   |
| Code Blk 4 | Most  |        | 3354 + | 2740 + | 3020 + | 3026 − |
|       | Least |        | 3846   | 4460   | 4180   | 2734   |
| Code Blk 5 | Most  |        |        |        |        | 2294 + |
|       | Least |        |        |        |        | 3466   |

| trBLK: |       | 23000  | 25500  | 25570  | 28000  |
|---|---|---|---|---|---|
| Code Blk 1 | Most  | 3455 − | 3205 − | 2664 − | 2462   |
|       | Least | 2305   | 2555   | 2136   | 2338   |
| Code Blk 2 | Most  | 2884   | 3206 − | 2666 − | 2462   |
|       | Least | 2877   | 2555   | 2134   | 2338   |
| Code Blk 3 | Most  | 2686 + | 3205 − | 2664 − | 2463   |
|       | Least | 3073   | 2554   | 2136   | 2337   |
| Code Blk 4 | Most  | 2688 + | 2431 + | 2499   | 2463   |
|       | Least | 3073   | 3330   | 2301   | 2337   |
| Code Blk 5 | Most  | 2687 + | 2353 + | 1953 + | 2462   |
|       | Least | 3072   | 3406   | 2847   | 2338   |
| Code Blk 6 | Most  |        |        | 1954 + | 2088 + |
|       | Least |        |        | 2846   | 2712   |

Example 3

A transport block of 30000 bits (from Table 1) has been simulated. It consists of 6 code-blocks, of which the first one is "difficult" while code blocks 3-6 are "easy" to decode.

TABLE 3

HSDPA 15-code QAM64 transport block format (size: 30000 bits, total soft-bit buffer: 43200 bits) and distribution of soft-bits within code-blocks.

| Code block | 1 | 2 | 3 | 4 | 5 | 6 |
|---|---|---|---|---|---|---|
| Most | 2004 | 2380 | 2504 | 2504 | 2504 | 2504 |
| Mid | 2003 | 2381 | 2504 | 2504 | 2504 | 2504 |
| Least | 3193 | 2439 | 2192 | 2192 | 2192 | 2192 |

Various iteration setups have been simulated (AWGN, Ior/Ioc chosen to have approx. 20% BLER):
Iterations per the code-blocks 1-6 of table 3:

| 1 | 2 | 3 | 4 | 5 | 6 | BLER |
|---|---|---|---|---|---|---|
| 50 | 50 | 50 | 50 | 50 | 50 | 0.174497 |
| 30 | 30 | 30 | 30 | 30 | 30 | 0.174497 |
| 25 | 30 | 30 | 30 | 30 | 30 | 0.194631 |
| 20 | 30 | 30 | 30 | 30 | 30 | 0.214765 |
| 15 | 30 | 30 | 30 | 30 | 30 | 0.261745 |
| 10 | 30 | 30 | 30 | 30 | 30 | 0.496644 |
| 5 | 30 | 30 | 30 | 30 | 30 | 0.932886 |

Conclusion: "difficult" code-block number 1, requires 25-30 iterations to reach maximum performance.
Iterations per the code-blocks 1-6 of table 3:

| 1 | 2 | 3 | 4 | 5 | 6 | BLER |
|---|---|---|---|---|---|---|
| 30 | 30 | 30 | 30 | 30 | 30 | 0.174497 |
| 30 | 30 | 10 | 10 | 10 | 10 | 0.174497 |
| 30 | 30 | 8 | 8 | 8 | 8 | 0.181208 |
| 30 | 30 | 6 | 6 | 6 | 6 | 0.214765 |
| 30 | 30 | 5 | 5 | 5 | 5 | 0.302013 |

Conclusion: "easy" code-blocks (numbers 3-6) require only 8-10 iterations to reach maximum performance.

These results confirm radically different iteration requirements of various code-blocks and that difficult code-blocks may require all remaining iteration budget for maximum performance, hence the need to minimize iterations used by "easy" blocks.

Note: with all iterations set to 60, residual BLER is 17.45% and it is not known which code-blocks are causing errors (however it is likely to be the first "difficult" one where TDEC failed to converge despite high iteration count).

In another test-case, lower number of iterations were simulated, and the total iteration budget (max. 42 iterations) was kept constant:
Iterations per the code-blocks 1-6 of table 3:

| 1 | 2 | 3 | 4 | 5 | 6 | BLER | |
|---|---|---|---|---|---|---|---|
| 7 | 7 | 7 | 7 | 7 | 7 | 0.255034 | << default |
| 11 | 7 | 6 | 6 | 6 | 6 | 0.100671 | |
| 15 | 7 | 5 | 5 | 5 | 5 | 0.0939597 | << best performance |
| 19 | 7 | 4 | 4 | 4 | 4 | 0.201342 | |
| 23 | 7 | 3 | 3 | 3 | 3 | 0.630872 | |

Conclusion: compared to fixed-iteration count per code-block, assigning more iterations to the first, most difficult code-block, brings improvement. Exact split of iterations between code-blocks also depends on total iteration count available and therefore will need to be simulated.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A method of decoding code blocks of a transport block of a communication signal using a decoder, the method comprising:
    for each of the code blocks of the transport block, making an assumption about a number of decoder iterations needed for decoding the code block, wherein the assumption is made based on a study of code block soft-bits;
    decoding the transport block using the assumed numbers of decoder iterations for code blocks of the transport block, wherein the assumed numbers of decoder iterations for two or more different code blocks are different.

2. The method of claim 1, wherein the assumption is made by using a pre-programmed look-up table.

3. The method of claim 1, wherein the assumption is made based on measurements of average absolute soft-bit value on each of the different code blocks to be decoded.

4. The method of claim 1, wherein the assumption is made based on a simulated distribution of different soft-bits in the different code blocks to be decoded.

5. The method of claim 1, wherein the decoder comprises an early exit function, the early exit function:
    allowing the decoding of a code block to be stopped after fewer iterations than the maximum number of iterations which are available for decoding of that code block if it has been determined that the code block has already been sufficiently decoded; and
    allowing iterations not used for decoding the code block due to early exit to be used for the decoding of another code block of the transport block.

6. The method of claim 5, further comprising storing information about which code block(s) the early exit function is used for exiting early, thereby allowing allocation of different numbers of decoder iterations to be used for the different code blocks based on this information if the transport block is to be decoded again due to a retransmission thereof.

7. The method of claim 1, wherein the decoding comprises first decoding a code block of the different code blocks for which a lowest number of iterations is assumed, and then decoding a code block of the different code blocks for which a higher number of iterations is assumed, thus allowing iterations not used for decoding the code block for which the lowest number of iterations is assumed to be used for the decoding of the code block for which the higher number of iterations is assumed.

8. A device for decoding code blocks of a transport block of a communication signal, the device comprising:
    a pre-decoding processing circuit configured to, for each of the code blocks of the transport block, make an assumption about a number of decoder iterations needed for decoding the code block, wherein the assumption is made based on a study of code block soft-bits;

a decoder configured to decode the transport block using the assumed numbers of decoder iterations for code blocks of the transport block, wherein the assumed numbers of decoder iterations for two or more different code blocks are different.

9. The device of claim 8, wherein the pre-decoding processing circuit is configured to make the assumption by using a look-up table.

10. The device of claim 8, wherein the pre-decoding processing circuit is configured to make the assumption based on measurements of average absolute soft-bit value on each of the different code blocks to be decoded.

11. The device of claim 8, wherein the pre-decoding processing circuit is configured to make the assumption based on a simulated distribution of different soft-bits in the different code blocks to be decoded.

12. The device of claim 8, wherein the decoder comprises an early exit function configured to:
   allow the decoding of a code block to be stopped after fewer iterations than the maximum number of iterations which are available for decoding of that code block, if it has been determined that the code block has already been sufficiently decoded; and
   allow iterations not used for decoding the code block due to early exit to be used for the decoding of another code block of the transport block.

13. The device of claim 12, further comprising a storage circuit configured to store information about for which code block(s) the early exit function is used for exiting early.

14. The device of claim 8, wherein the decoder is configured to:
   first decode a code block of the different code blocks for which a lowest number of iterations is assumed;
   then decode a code block of the different code blocks for which a higher number of iterations is assumed;
   thereby allowing iterations not used for decoding the code block for which the lowest number of iterations is assumed to be used for the decoding of the code block for which the higher number of iterations is assumed.

15. The device of claim 8, wherein the decoder is a turbo decoder.

16. A transmit-receive circuit comprising:
   a transmitter configured to transmit communication signals;
   a receiver configured to receive communication signals;
   a device for decoding code blocks of a transport block of a communication signal, the device comprising:
      a pre-decoding processing circuit configured to, for each of the code blocks of the transport block, make an assumption about a number of decoder iterations needed for decoding the code block, wherein the assumption is made based on a study of code block soft-bits;
      a decoder configured to decode the transport block using the assumed numbers of decoder iterations for code blocks of the transport block, wherein the assumed numbers of decoder iterations for two or more different code blocks are different.

17. The transmit-receive circuit of claim 16, wherein the pre-decoding processing circuit is configured to make the assumption by using a look-up table.

18. The transmit-receive circuit of claim 16, wherein the pre-decoding processing circuit is configured to make the assumption based on measurements of average absolute soft-bit value on each of the different code blocks to be decoded.

19. The transmit-receive circuit of claim 16, wherein the pre-decoding processing circuit is configured to make the assumption based on a simulated distribution of different soft-bits in the different code blocks to be decoded.

20. The transmit-receive circuit of claim 16, wherein the decoder comprises an early exit function configured to:
   allow the decoding of a code block to be stopped after fewer iterations than the maximum number of iterations which are available for decoding of that code block, if it has been determined that the code block has already been sufficiently decoded; and
   allow iterations not used for decoding the code block due to early exit to be used for the decoding of another code block of the transport block.

* * * * *